METHOD OF MAKING OHMIC CONTACT TO SEMICONDUCTOR DEVICES

Filed Oct. 18, 1968

INVENTORS
EDMUND WONILOWICZ &
HENRY F. MACHNACZ

BY W. S. Hill
AGENT

United States Patent Office 3,579,375

Patented May 18, 1971

3,579,375

METHOD OF MAKING OHMIC CONTACT TO SEMICONDUCTOR DEVICES

Edmund Wonilowicz, Englishtown, and Henry F. Machnacz, Somerville, N.J., assignors to RCA Corporation Filed Oct. 18, 1968, Ser. No. 768,719
Int. Cl. B44d 1/14
U.S. Cl. 117—212 4 Claims

ABSTRACT OF THE DISCLOSURE

A method of making ohmic contacts to a semiconductor device wherein aluminum is deposited on at least one of several contact areas on the semiconductor body, nickel is deposited electrolessly simultaneously on the aluminum layer and on a contact area not covered with aluminum, the nickel layer being built up in a series of separate depositions, the nickel is sintered after each deposition and solder is finally deposited on all the nickel surfaces.

BACKGROUND OF THE INVENTION

Semiconductor devices such as transistors of the planar type include a thin emitter region of one conductivity type extending inward from a surface of a semiconductor body, an adjacent base region of opposite conductivity type beneath, and usually surrounding, the emitter region and a P-N junction between the two regions. Good ohmic contact to the surface of the emitter region is a necessity for successful device operation.

There are several different types of ohmic contacts to semiconductor bodies in current use. One of these is the nickel-solder type. This type comprises a thin layer of nickel sintered to the surface of the semiconductor body and a relatively thick layer of a solder, such as a tin-lead solder, adhering to the nickel layer. This contact system has several advantages such as:

(a) Low capital expenditure in that belt type furnaces can be used to simultaneously mount the semiconductor device pellet to a header and bond clips to the pellet;

(b) Low production cost since a large number of devices can be handled simultaneously by one operator;

(c) High current handling capability due to use of relatively massive connectors;

(d) Mechanical ruggedness;

(e) Good second breakdown characteristics due to uniform contacts provided by sintered nickel; and (f) Ability to withstand cleanup procedures using caustic alkali etches.

However, it has been found that the nickel-solder type ohmic contact also has certain disadvantages in some types of devices. Some power transistors have emitter regions and base regions which comprise interdigitated fingers in order to secure a high ratio of emitter periphery to emitter area and consequently better current distribution. In this type of transistor, the current paths through the emitter contact layer and through the base contact layer are relatively long. Soft solders have a relatively high sheet resistivity and this results in relatively high I.R. drop along the electrode fingers.

Another type of ohmic contact system in common use is aluminum which is vacuum evaporated and then alloyed into the semiconductor body. Aluminum has the advantage of providing relatively low I.R. drops on interdigitated emitter-base contacts because of its low sheet resistivity. It has the further advantage of having its contact areas defined very accurately because of the ease of preferentially etching it away where it is not wanted.

However, aluminum contacts are more expensive to bond wires to since each wire must be individually attached by a method such as thermocompression bonding.

OBJECTS OF THE INVENTION

One object of the present invention is to provide an improved ohmic contact system for semiconductor devices.

A further object of the invention is to provide an economical method of making ohmic contacts to transistors which has the advantage of utilizing evaporated metal contacts where these are beneficial, and, at the same time, making use of soldered wire connections.

SUMMARY OF THE INVENTION

The invention comprises an improved method of making ohmic contacts to semiconductor devices comprising depositing an evaporated layer of aluminum on one of the contact areas of the device while leaving another contact area free of aluminum, and then simultaneously depositing nickel, electrolessly, on both the aluminum surface and said another contact area of the device not covered with aluminum, sintering the nickel at relatively low temperatures, building up the nickel layer with repeated depositions and sintering treatments, and, finally, depositing solder on the nickel layers.

THE DRAWING

PREFERRED EMBODIMENT

The following is a description of how to utilize the method of the present invention in making a diffused junction planar transistor.

Figure 1:
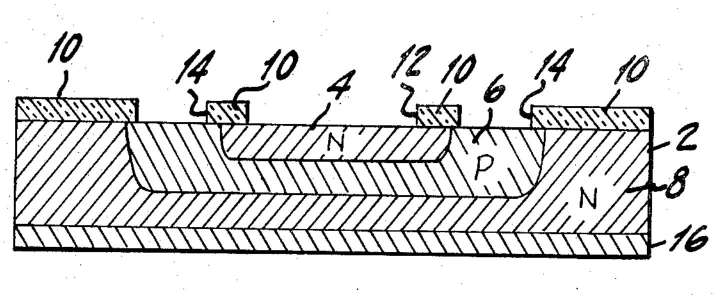
FIG. 1 is a cross-section view illustrating an early stage in making ohmic contacts to a device in accordance with the method of the present invention.

As illustrated in FIG. 1, one may start with a wafer of N type silicon 2 and, by diffusing appropriate impurities, form a base region 6 of P type conductivity and an emitter region 4 of N type conductivity therein. Both the base region and the emitter region extend to the top surface of the semiconductor body.

The top surface of the body is then protected with an insulating layer 10, which, in this case, is silicon dioxide. This may be deposited by any conventional method. By conventional masking and etching procedures, an emitter opening 12 is formed in the silicon dioxide layer 10 which exposes part of the emitter region 4. Another opening 14, of annular shape, is also made in the silicon dioxide layer 10 to expose part of the base region 6.

The bottom of the wafer 2 has a nickel layer 16 applied thereto by electroless deposition using a conventional alkaline plating solution. The plating solution may comprise, for example, nickel chloride, sodium hypophosphite, sodium hydroxy acetate and a wetting agent. The layer 16 is then sintered at 800° C. in hydrogen so that the nickel adheres well to the silicon wafer.

Figure 2:
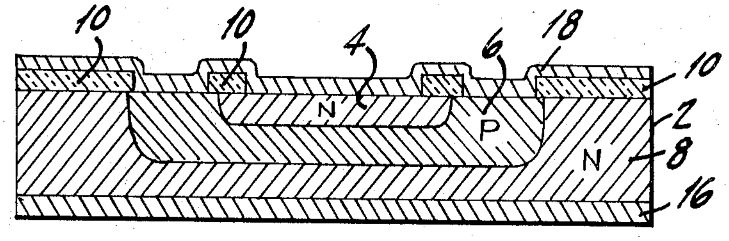
FIG. 2 is a cross-section view of the device of FIG. 1 in a later stage of manufacture.

Next, a layer of aluminum 18 (FIG. 2) is evaporated over the entire top surface of the device. This layer has a thickness of about 20,000 to 40,000 A.

Figure 3:
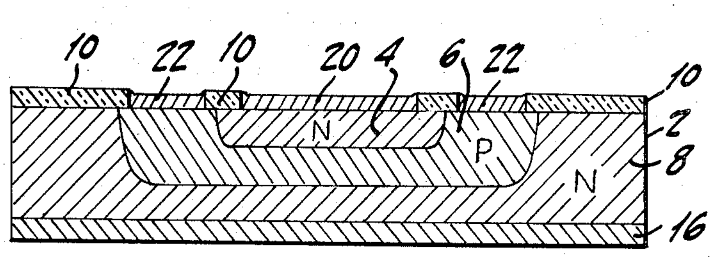
FIG. 3 is a cross-section view similar to that of FIG. 2 showing the device in a still later stage of manufacture.

The next step is to define the emitter connection pattern and the base connection pattern. This is accomplished by conventional photoresist masking and etching procedures with the photoresist being removed after the etching operation is complete. The aluminum layer 18 is etched electrolytically in a solution of sodium hydroxide. As shown in FIG. 3, this results in leaving an emitter contact 20 composed of aluminum within the emitter contact opening 12. It also results in leaving a base contact 22 of aluminum within the base contact opening 14.

The assembly is next heated at 560° C. for 3 minutes in a nitrogen atmosphere. This causes the aluminum emitter contact 20 and the base contact 22 to alloy with the silicon semiconductor wafer.

The next step in the process is to clean up the entire wafer, using a buffered oxide etch which may consist of 454 grams ammonium fluoride and 163 ml. hydrofluoric acid in 680 ml. of water.

The present improved method permits the application of a solder coating to both sides of the device simultaneously. First, the wafer is treated by dipping in a solution comprising sodium potassium tartrate, sodium hydroxide and zinc oxide in order to prepare the aluminum surfaces for further treatment of nickel. In the past it has been thought that temperatures needed to sinter nickel to a substrate were too high for sintering to aluminum, and when relatively thick coatings of nickel have been applied they have tended to peel off the surface after a time. It has now been found, however, that both sides of the wafer may be plated simultaneously if nickel is deposited from a conventional alkaline solution by an electroless method and if the nickel is deposited in a series of plating operations with sintering of the nickel between each plating step.

The first nickel layer is deposited to a thickness of 0.03 mil. This takes 2 minutes at about 80° C. The nickel layer is then sintered at about 400° C. (±20°) for about 12 to 18 minutes in nitrogen in order to cause the metal layer to adhere well to the under surface. The wafer is then cleaned once more in a buffered oxide etch, as described above, and again plated with a thickness of 0.03 mil of nickel. The assembly is also subjected to another sintering step in which the nickel is sintered at 400° C. for about 12–18 minutes in nitrogen atmosphere.

Figure 4:
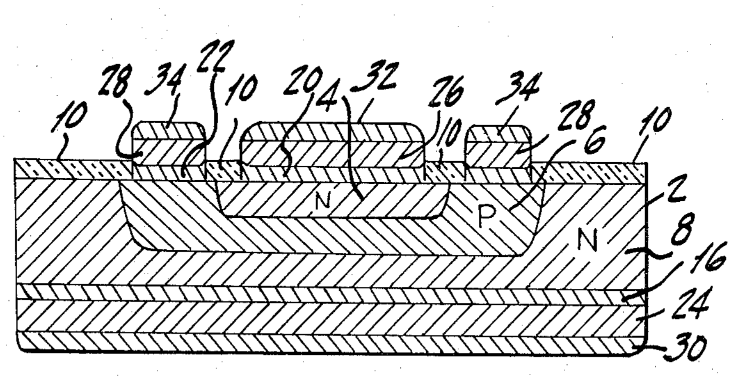
FIG. 4 is a cross-section view similar to that of FIGS. 2 and 3 showing the completed device.

Again the wafer is cleaned in a buffered oxide etch, as described above, and a third layer of nickel having a thickness of about 0.03 mm. is deposited. This time the nickel is not sintered. The composite nickel layer (FIG. 4) has been designated as 24 on the collector side of the transistor, as 26 on the emitter contact and as 28 on the base contact.

The wafer is then dipped in solder, which may be a conventional 5% tin, 95% lead composition, using zinc chloride as a flux. This forms a layer of solder 30 over the nickel layer 24 on the collector, a solder layer 32 over the nickel layer 26 of the emitter, and a solder layer 34 over the nickel layer 28 of the base contact.

What is claimed is:

1. In a method of making a semiconductor device the steps comprising:

depositing aluminum on at least one contact area of a semiconductor body while leaving at least one other contact area on said body free of aluminum, depositing a composite layer of nickel electrolessly simultaneously on only said contact areas in a series of at least three separate depositions, sintering the nickel at about 400° C. after each deposition except the last one, and depositing a layer of solder on the nickel surfaces.

2. A method according to claim 1 in which the wafer is cleaned in a buffered oxide etch consisting of ammonium fluoride, hydrofluoric acid and water after each nickel deposition step.

3. A method according to claim 1 in which the semiconductor material is silicon, and the thickness of said composite layer of nickel is about 0.09 mil.

4. A method according to claim 3 in which said sintering is carried out in a nitrogen atmosphere for about 12–18 minutes.

References Cited

UNITED STATES PATENTS

| | | | |
|---|---|---|---|
| 3,046,176 | 7/1962 | Bosenberg | 117—217UX |
| 3,362,851 | 1/1968 | Dunster | 317—234/5.3UX |
| 3,418,170 | 12/1968 | Amsterdam et al. | 317—234/5.3UX |
| 3,419,765 | 12/1968 | Clark et al. | 317—234/5.3 |
| 3,453,501 | 7/1969 | Dunkle | 317—234/5.3 |
| 3,479,736 | 11/1969 | Toki et al. | 117—212X |

ALFRED L. LEAVITT, Primary Examiner

C. K. WEIFFENBACH, Assistant Examiner

U.S. Cl. X.R.

117—217; 317—234